(12) United States Patent
Liu et al.

(10) Patent No.: US 11,203,704 B2
(45) Date of Patent: Dec. 21, 2021

(54) HIGH TEMPERATURE RESISTANT MASKING ADHESIVE COMPOSITION

(71) Applicant: 3M INNOVATIVE PROPERTIES COMPANY, St. Paul, MN (US)

(72) Inventors: Richard Yufeng Liu, Woodbury, MN (US); Yi Lin Sim, Singapore (SG); Chin Teong Ong, Singapore (SG); Roger A. Grisle, Woodbury, MN (US); Michael C. Martin, Hudson, WI (US); Nathaniel I. Lehn, White Bear Lake, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/969,094

(22) PCT Filed: Mar. 20, 2019

(86) PCT No.: PCT/IB2019/052280
§ 371 (c)(1),
(2) Date: Aug. 11, 2020

(87) PCT Pub. No.: WO2019/180647
PCT Pub. Date: Sep. 26, 2019

(65) Prior Publication Data
US 2021/0032513 A1    Feb. 4, 2021

Related U.S. Application Data

(60) Provisional application No. 62/646,050, filed on Mar. 21, 2018.

(51) Int. Cl.
*H05K 3/30*    (2006.01)
*H05K 3/34*    (2006.01)
(Continued)

(52) U.S. Cl.
CPC ............ *C09J 153/02* (2013.01); *H05K 3/305* (2013.01); *H05K 3/3494* (2013.01)

(58) Field of Classification Search
CPC ............ H05K 3/30; H05K 3/34; H05K 3/305; H05K 3/0076; H05K 3/3494; C08K 5/00;
(Continued)

(56) References Cited

U.S. PATENT DOCUMENTS 5,502,085 A    3/1996    Ohura
6,399,178 B1    6/2002    Chung
(Continued)

FOREIGN PATENT DOCUMENTS

CN    104610891    5/2015
GB    2350321    11/2000
(Continued)

OTHER PUBLICATIONS

International Search Report for PCT International Application No. PCT/IB2019/052280, dated Jul. 17, 2019, 7 pages.

*Primary Examiner* — Xiaoliang Chen
(74) *Attorney, Agent, or Firm* — Jeffrey M. Olofson

(57) ABSTRACT

Hot melt processable adhesive compositions to mask electronic components include at least one block copolymer, at least one tackifying resin, at least one semi-crystalline polyolefin polymer, at least one plasticizer, and at least one anti-oxidant. The adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

22 Claims, 1 Drawing Sheet

(51) Int. Cl.
*C08K 5/00* (2006.01)
*C08K 5/17* (2006.01)
*C08K 5/05* (2006.01)
*C08K 5/16* (2006.01)
*C09J 123/10* (2006.01)
*C09J 153/02* (2006.01)

(58) Field of Classification Search
CPC ........ C08K 5/17; C08K 5/005; C08K 5/0016; C09J 153/02
USPC ........ 361/760; 524/236, 270, 351, 379, 386, 524/437, 449, 487, 515, 528; 525/191, 525/240; 526/348, 351
See application file for complete search history.

(56) References Cited

U.S. PATENT DOCUMENTS

| | | | |
|---|---|---|---|
| 2006/0020067 A1* | 1/2006 | Brant | C08L 2666/24 524/236 |
| 2014/0256867 A1 | 9/2014 | Puerkner | |
| 2017/0260350 A1 | 9/2017 | Bieber | |
| 2018/0370683 A1 | 12/2018 | Zimmel | |

FOREIGN PATENT DOCUMENTS

| | | |
|---|---|---|
| JP | 02258880 | 10/1990 |
| JP | 2013032504 | 2/2013 |
| JP | 2014141659 | 8/2014 |
| JP | 2014141660 | 8/2014 |
| KR | 20170043619 | 4/2017 |

* cited by examiner

HIGH TEMPERATURE RESISTANT MASKING ADHESIVE COMPOSITION

FIELD OF THE DISCLOSURE

The present disclosure relates to hot melt processable masking adhesive compositions that have high temperature resistance, and to articles and methods that contain these hot melt processable masking adhesive compositions.

BACKGROUND

Adhesives have been used for a variety of marking, holding, protecting, sealing and masking purposes. Adhesive tapes generally comprise a backing, or substrate, and an adhesive. One type of adhesive, a pressure sensitive adhesive, is particularly useful for many applications. Pressure sensitive adhesives are well known to one of ordinary skill in the art to possess certain properties at room temperature including the following: (1) aggressive and permanent tack at room temperature, (2) adherence with no more than finger pressure, (3) sufficient ability to hold onto an adherend, and (4) sufficient cohesive strength to be removed cleanly from the adherend. Materials that have been found to function well as pressure sensitive adhesives are polymers designed and formulated to exhibit the requisite viscoelastic properties resulting in a desired balance of tack, peel adhesion, and shear strength. The most commonly used polymers for preparation of pressure sensitive adhesives are natural rubber, synthetic rubbers (e.g., styrene/butadiene copolymers (SBR) and styrene/isoprene/styrene (SIS) block copolymers), various (meth)acrylate (e.g., acrylate and methacrylate) copolymers and silicones. Each of these classes of materials has advantages and disadvantages.

Pressure sensitive adhesives and tapes that are used in the manufacture of articles to protect or temporarily hold in place components of the article during processing are sometimes called processing tapes or processing adhesives. Examples of processing tapes include, for example, wafer dicing tapes, where the dicing tape may also function as a die attach adhesive for dicing thinned wafers and subsequent die attach operations of the diced chips in semiconductor device fabrication. Another example of a processing tape is a masking tape, where the masking tape is applied to a surface to cover it and protect it from being painted, the paint is applied, and the masking tape is removed to give a surface with adjacent areas that are painted and unpainted. Typically the processing tape or adhesive is not retained in the final article, but is removed following one or more processing steps. In some instances, processing tapes or adhesives are subjected to extreme conditions such as high temperatures, high pressures, exposure to chemicals such as solvents, abrasives, etching materials, and the like and yet are expected to remain adhered during the processing steps without flowing, dripping or slipping and also to be removable after the processing steps are completed.

SUMMARY

The present disclosure relates to hot melt processable masking adhesive compositions that have high temperature resistance, and to articles and methods that contain these hot melt processable masking adhesive compositions. In some embodiments, the hot melt processable adhesive composition comprises at least one block copolymer, at least one tackifying resin, at least one semi-crystalline polyolefin polymer, at least one plasticizer, and at least one anti-oxidant. The adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

Also disclosed are articles. In some embodiments, the article comprises an electronic device comprising a substrate with a first major surface and a second major surface, with a variety of electronic components disposed on the first major surface of the substrate, and a masking adhesive layer disposed on at least a portion of the first major surface of the substrate and/or at least one electronic component disposed on the first major surface of the substrate. The masking adhesive has been described above and comprises at least one block copolymer, at least one tackifying resin, at least one semi-crystalline polyolefin polymer, at least one plasticizer, and at least one anti-oxidant. The adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

Also disclosed are methods of preparing devices using the hot melt processable adhesives described above. In some embodiments, the method of preparing a device comprises providing an electronic device comprising a substrate with a first major surface and a second major surface, with a variety of electronic components disposed on the first major surface of the substrate, providing a hot melt processable masking adhesive, melting the adhesive composition in a receptacle, hot melt dispensing the molten hot melt processable adhesive composition on at least a portion of the first major surface of the substrate, on at least one electronic component disposed on the first major surface of the substrate, or a combination of the first major surface and at least one electronic component to form a masking adhesive layer, processing the electronic device such that processing involves at least subjecting at least a portion of the electronic device to a temperature of 260° C., and removing the masking adhesive layer after processing.

BRIEF DESCRIPTION OF THE DRAWINGS

The present application may be more completely understood in consideration of the following detailed description of various embodiments of the disclosure in connection with the accompanying drawings.

DETAILED DESCRIPTION

Figure 1:
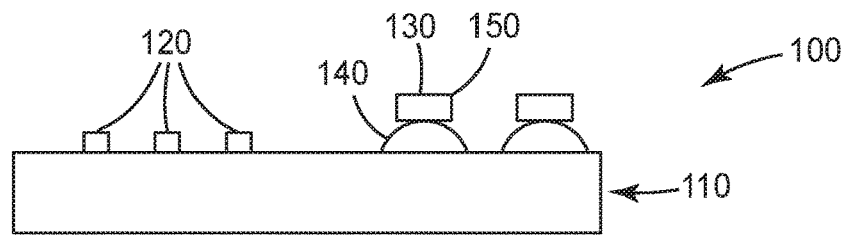
FIG. 1 is a cross sectional view of an embodiment of a precursor article of the present disclosure.

The use of adhesive articles is increasing. Besides the typical uses for adhesive articles of holding together substrates in an article, adhesives are increasing used in processing applications. In these processing applications, the adhesive articles are applied, one or more processes are carried out, and the adhesive article is removed. Examples of processes that can be carried out include processes such as wafer dicing, where an adhesive is used to hold a wafer in place during the dicing process steps, and then the processed wafer is removed from the adhesive.

Another processing use for adhesive articles is for masking. Masking tapes have been used for many decades, for example in the area of painting. The masking tape is applied to a surface that the user does not wish to be painted such that when paint is applied it is applied to the masking tape and not to the surface that the masking tape is covering. The masking tape is then removed to reveal the surface that is free from paint.

As manufacturing processes have become increasing complex and specialized, for example in the electronic and optical industries, processing tapes, such as masking tapes, have likewise been developed that have a variety of specialized features. One feature that is becoming increasingly important in the electronics industry is the ability for a masking tape to protect sensitive electronic components during processing steps. The masking tape protects the electronic components from heat and contamination during steps such as grinding, etching, and solder reflow. Such steps can involve mechanical, chemical, and thermal processes or combinations thereof that can adversely affect the sensitive electronic components. Thus the masking tape protects the sensitive electronic components during the processing steps and is then removed to re-expose the sensitive electronic component.

As electronic components have become smaller and as automated processing lines have become faster, the use of tapes for masking purposes can become difficult, as the tapes have to be cut to size, properly positioned, etc. To overcome these difficulties, liquid masks can be used. The liquid masking material is dispensed onto the components to be protected, the liquid is allowed to solidify to form the mask, and after the processing steps are carried out, the solidified mask is removed. Hot melt processable adhesives, especially hot melt processable pressure sensitive adhesives, are particularly suitable for use as liquid masks.

In the adhesive art, "hot melt adhesives" and "hot melt processable adhesives" such as "hot melt processable pressure sensitive adhesives" are very different materials. A hot melt adhesive is a thermoplastic material that flows upon heating, is dispensed in the molten state onto a substrate, an adherend is then contacted to the hot melt adhesive while still in the hot and molten state, and upon cooling the thermoplastic material re-solidifies to form the adhesive bond. The thermoplastic remains a solid unless the material is again re-heated to a temperature sufficient to melt the thermoplastic material. Such materials are used extensively in manufacturing processes, such as furniture manufacturing, where two wooden components are hot melt bonded and clamped together until the hot melt adhesive cools and hardens to form a strong adhesive bond. Such materials are not well suited for use as masking materials for processes that involve heating, because upon heating the masking material can melt and flow. This melting and flowing can be messy and can leave the electronic component exposed.

A hot melt processable pressure sensitive adhesive on the other hand is a pressure sensitive adhesive that can be hot melt processed. Unlike a hot melt adhesive, the hot melt processable pressure sensitive adhesive is a viscoelastic material. By this it is meant that the material has the properties of a viscous flow material (such as honey) and an elastomeric material (such as a rubber). This combination of material properties gives pressure sensitive adhesives the unique properties that define the class of materials designated as pressure sensitive adhesives. Pressure sensitive adhesive compositions are well known to those of ordinary skill in the art to possess properties including the following: (1) aggressive and permanent tack at room temperature, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process.

However, the use of hot melt processable pressure sensitive adhesives as liquid masks can also present difficulties. Since the materials are hot melt processable, upon heating they can be made to flow, and thus can have the same issues as hot melt adhesives, although since they are viscoelastic materials they do not flow as readily as the thermoplastic hot melt adhesives. Additionally, the pressure sensitive adhesives while one does not want the masking material to flow during a processing step that involves heating, one does want the masking material retain their clean removability so that the mask is removable after the processing steps. These contradictory properties rule out some techniques that could be used to provide a high temperature stable masking material. For example, one way to decrease the flowability of pressure sensitive adhesive would be to add a post-dispensing crosslinking step. This crosslinking would convert the hot melt processable material to one that no longer can flow. However, crosslinking a pressure sensitive adhesive that is dispensed onto a surface also increases the adhesion to that surface and frequently renders the adhesive layer non-removable.

Thus there remains a need for a liquid masking composition that has seemingly contradictory property requirements. Thus the desired liquid masking composition is able to be applied in a liquid state, upon dispensing it forms a protective solid layer rapidly to permit high speed manufacturing processes, it is able to withstand a wide range of processing conditions such as the application of heat or mechanical pressure, and is cleanly removable. Clean removability is important because if residue from the mask is left behind, an additional cleaning step to remove the residue will have to be employed. Thus the need is for a material that is dispensable as a liquid, does not flow when heated during a processing step, and is cleanly removable. Such a combination of properties is extremely difficult to achieve.

In addition to these requirements, already very stringent, in many cases it is desired or required that the masking layer have optical properties. In many cases, the desired optical property is optical transparency so that the masked components can be monitored visually. In other cases, the desired optical property is that the masking layer be colored, especially colored in such a way as to match the color of the components that the masking layer is protecting.

In this disclosure, hot melt processable adhesive compositions are described that have the desired properties of hot melt dispensability, thermal stability so as to withstand relatively high temperatures (such as 260° C.) without degradation or flowing, desirable optical properties, and clean removability. These contradictory properties can be achieved through the use of mixtures that include at least one block copolymer, at least one tackifying resin, at least one semi-crystalline polyolefin polymer, at least one plasticizer, and at least one anti-oxidant.

Also included in this disclosure are articles that include the hot melt processable adhesive compositions and methods for using these hot melt processable adhesive compositions to prepare articles.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "adhesive" as used herein refers to polymeric compositions useful to adhere together two adherends. Examples of adhesives are pressure sensitive adhesives.

Pressure sensitive adhesive compositions are well known to those of ordinary skill in the art to possess properties including the following: (1) aggressive and permanent tack at room temperature, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process. The term "hot melt processable pressure sensitive adhesive" refers to a material that is hot melt processable, meaning that it can be heated and made to flow, but at room temperature is a pressure sensitive adhesive. Hot melt processable pressure sensitive adhesives are different from hot melt adhesives as hot melt adhesives are thermoplastic materials that melt and flow but are thermoplastic solids (not viscoelastic materials) at room temperature and are not pressure sensitive adhesives.

Unless otherwise indicated, the terms "transparent" and "optically transparent" are used interchangeably and refer to an article, film or adhesive that has a high light transmittance over at least a portion of the visible light spectrum (about 400 to about 700 nm). The term "transparent film" refers to a film having a thickness and when the film is disposed on a substrate, an image (disposed on or adjacent to the substrate) is visible through the thickness of the transparent film. In many embodiments, a transparent film allows the image to be seen through the thickness of the film without substantial loss of image clarity. In some embodiments, the transparent film has a matte or glossy finish. Optically transparent materials typically have a % T (percent transmittance) of visible light of at least 50%, often 80% or more.

As used herein, the term "polymer" refers to a polymeric material that is a homopolymer or a copolymer. As used herein, the term "homopolymer" refers to a polymeric material that is the reaction product of one monomer. As used herein, the term "copolymer" refers to a polymeric material that is the reaction product of at least two different monomers. Block copolymers are polymers that have sequences of a single monomer to form blocks of that monomer. Examples of block copolymers are, di-block, tri-block, multi-block, radial-block, or star-block copolymers.

The terms "tackifying resin", "tackifying agent" and "tackifier" are used interchangeably herein.

The terms "plasticizing resin", "plasticizing agent" and "plasticizer" are used interchangeably herein.

The terms "room temperature" and "ambient temperature" are used interchangeably and refer to a temperature of from 20-25° C.

Disclosed herein are hot melt processable adhesive compositions. These hot melt processable adhesive compositions are blend compositions comprising a mixture of at least one block copolymer, at least one tackifying resin at least one semi-crystalline polyolefin polymer, at least one plasticizer, and at least one anti-oxidant. The adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable. In some embodiments, the hot melt processable adhesive composition has desirable optical properties. In some embodiments, the desirable optical properties include optical transparency. In other embodiments, the hot melt processable adhesive composition further comprises at least one colorant such that the hot melt processable adhesive composition matches the color of a surface to be masked by the hot melt processable adhesive composition.

In some embodiments, the hot melt processable adhesive composition comprises 20-60 weight % of at least one block copolymer, 20-40 weight % of at least one tackifying resin, 3-20 weight % of at least one semi-crystalline polyolefin polymer, 5-40 weight % of at least one plasticizer, and 0.01-4 weight % of at least one anti-oxidant, where weight % is determined by the total weight of the adhesive composition.

A wide range of block copolymers are suitable for use as the at least one block copolymer of the hot melt processable adhesive composition. Typically, the hot melt processable adhesive composition comprises at least one block selected from styrene, ethylene, propylene, isoprene, butylene, butadiene, butene, butadiene, octene, pentene, or any combination thereof.

In some embodiments, the at least one block copolymer comprises an optically transparent di-block, tri-block, multi-block, radial-block, or star-block polystyrene-polyolefin block copolymer or a combination thereof. A wide range of optically transparent block copolymers are suitable, in some embodiments, the at least one block copolymer comprises an optically transparent di-block copolymer of styrene and ethylene/propylene or an optically transparent tri-block copolymer of styrene and ethylene and butylene. Examples of suitable commercially available styrene-containing block copolymers include those polymer series available from the Kraton Corporation under the trade names KRATON G and KRATON D.

The hot melt processable adhesive composition also comprises at least one tackifying resin, also referred to as a tackifier. A wide range of tackifying resins are suitable for use in the hot melt processable adhesive composition. In some embodiments, the at least one tackifying resin is selected from a C4 hydrocarbon tackifier, a C9 hydrocarbon tackifier, a rosin ester tackifier, a terpene tackifier, and a terpene phenol tackifier, or any combination thereof. In some embodiments it may be desirable that the at least one tackifying resin has a softening point of from 80° C. to 180° C. Such tackifying resins are well known in the art. Examples of suitable commercially available tackifying resins include those available from Eastman Chemical Company under the trade name REGALREZ and Cray Valley under the trade name of WINGTACK, and ExxonMobil under the trade name ESCOREZ.

The hot melt processable adhesive composition also comprises at least one semi-crystalline olefin polymer. A wide range of semi-crystalline olefin polymers are suitable. In some embodiments, the at least one semi-crystalline olefin polymer comprises blocks or segments of ethylene, propylene, butene, hexene, octene, or any combination thereof. Particularly suitable semi-crystalline olefin polymers include polyethylene, polypropylene, LLDPE (linear low density polyethylene), LDPE (low density polyethylene), HDPE (high density polyethylene), or block or random copolymers thereof.

Generally, it is desirable that the semi-crystalline olefin polymers do not have too high of a level of crystallinity. If the olefin polymers have a high level of crystallinity, it can adversely affect the optical properties of the hot melt processable adhesive composition. In some embodiments, the at least one semi-crystalline olefin polymer has a crystalline melt enthalpy as measured by DSC in the range of 1-80 Joules/gram. Crystalline melt enthalpy can be measured by DSC following standard testing procedures.

The hot melt processable adhesive composition also comprises at least one plasticizer or plasticizing agent comprises a processing oil. A wide range of processing oils are suitable. Examples of suitable processing oils include a non-aromatic paraffinic oil, an aromatic oil, a naphthenic oil, or a combination thereof.

The hot melt processable adhesive composition also comprises at least one anti-oxidant. Examples of suitable anti-oxidants include benzenepropanoic acid, hydroxy methyl ester, pentaerythritol tetrakis hydroxyphenyl propionate, bis(dodecylthiomethyl) methylphenol, octadecyl hydroxyphenyl propionate, butylphenyl phosphite, or mixtures thereof. Particularly suitable anti-oxidants include those commercially available from BASF under the trade name IRGANOX.

The hot melt processable adhesive composition may also include one or more additional additives provided the additives do not adversely affect the properties of the hot melt processable adhesive composition. If it is desirable that the hot melt processable adhesive composition be colored, at least one colorant may be added. Examples of suitable colorants include pigments and dyes.

Also disclosed herein are articles that include a masking adhesive layer that comprises the hot melt processable adhesive compositions described above. In some embodiments, the articles comprise an electronic device comprising, where the electronic device comprises a substrate with a first major surface and a second major surface, with a variety of electronic components disposed on the first major surface of the substrate, and a masking adhesive layer disposed on at least a portion of the first major surface of the substrate and/or at least one electronic component disposed on the first major surface of the substrate. As described above, the masking adhesive comprises a hot melt processable adhesive composition comprising at least one block copolymer, at least one tackifying resin, at least one semi-crystalline polyolefin polymer, at least one plasticizer, and at least one anti-oxidant. The adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

In some embodiments of the articles of this disclosure, the masking adhesive layer has been applied by 3D (3 dimensional) printing. In other embodiments, the masking adhesive layer has been applied by hot melt jetting at a temperature of 100-200° C.

As was mentioned above, in some embodiments the masking adhesive layer is optically transparent. In other embodiments, the masking adhesive layer is a colored layer, wherein the masking adhesive layer color is such that it matches the component on which it is disposed.

The masking adhesive layer can be continuous or discontinuous and can have a wide range of thicknesses. Typically the masking adhesive layer has a thickness of from 10 micrometers to 10 millimeters.

Also disclosed herein are methods of preparing devices. In some embodiments, the method of preparing a device comprises providing an electronic device, where the electronic device comprises a substrate with a first major surface and a second major surface, with a variety of electronic components disposed on the first major surface of the substrate, providing a hot melt processable masking adhesive, melting the adhesive composition in a receptacle, hot melt dispensing the molten hot melt processable adhesive composition on at least a portion of the electronic device to form a masking adhesive layer, processing the electronic device such that processing involves at least subjecting at least a portion of the electronic device to a temperature of 260° C., and removing the masking adhesive layer after processing. Dispensing the molten hot melt processable adhesive composition on at least a portion of the electronic device comprises dispensing the hot melt processable adhesive composition on the first major surface of the substrate, on at least one electronic component disposed on the first major surface of the substrate, or a combination of the first major surface and at least one electronic component.

The masking adhesive comprises a hot melt processable adhesive composition comprising at least one block copolymer, at least one tackifying resin, at least one semi-crystalline polyolefin polymer, at least one plasticizer, and at least one anti-oxidant, as is described in detail above. As mentioned above, the adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

The receptacle may be any suitable hot melt apparatus such as an extruder, a melt mixer, and the like. The hot melt processable composition can be hot melt mixed and held in a molten state for an extended period of time prior to dispensing.

A wide range of hot melt dispensing methods can be used to dispense the hot melt processable adhesive composition. In some embodiments, hot melt processable adhesive composition may be dispensed by hot melt jetting at a temperature of 100-200° C. In other embodiments, the hot melt processable adhesive composition may be dispensed by 3D (3 dimensional) printing using a 3D printing device.

A wide variety of processing techniques can be carried out on the masked electronic devices of the present disclosure. These techniques include, for example, grinding, etching, and solder reflow. Solder reflow is a particularly applicable technique for use in the methods of this disclosure. In this technique, the masked article contains solder paste that connects two electronic components. In the solder reflow process, the article is heated to a sufficiently high temperature to melt the solder paste and form a permanent connection.

The method of the present disclosure can be further understood by referring to FIGS. 1-4. FIG. 1 shows a cross sectional view of article 100. Article 100 includes substrate 110 on which are disposed electronic components with wires 120, and electronic components 130, where electronic components 130 include solder paste bumps 140 and connective elements 150.

Figure 2:
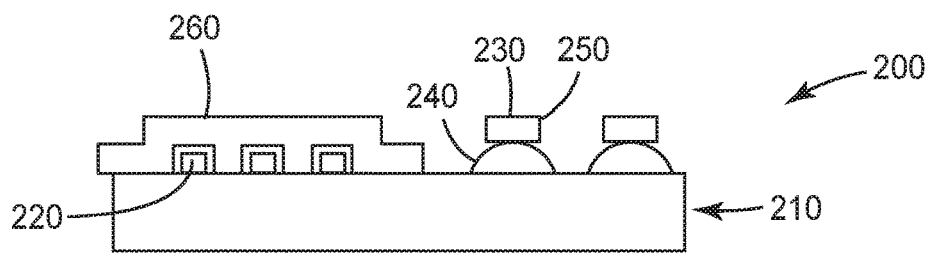
FIG. 2 is a cross sectional view of an embodiment of a masked article of the present disclosure.

FIG. 2 shows a cross sectional view of the article of FIG. 1 to which a masking layer 260 has been applied to cover wires 220 to form article 200. Masking layer 260 comprises a hot melt processable adhesive layer as described above and has been applied either with a hot melt jetting device or by a 3D printing device. The masking layer 260 is contact with electronic components with wires 220 and with a portion of the surface of substrate 210. Electronic components 230 with solder paste bumps 240 and connective elements 250 are not masked.

Figure 3:
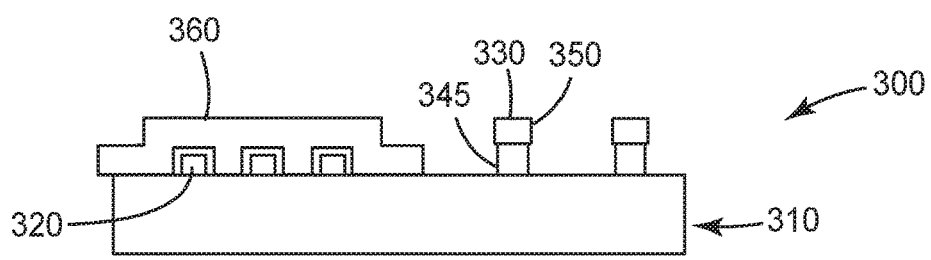
FIG. 3 is a cross sectional view of an embodiment of a masked article that has undergone a processing step of the present disclosure.

FIG. 3 shows article 300 which is article 200 from FIG. 2 that has undergone the processing step of solder reflow by heating to a temperature of up to 260° C. Substrate 310 with electronic components with wires 320 that are masked by masking layer 360 remain unchanged from FIG. 2. Electrical components 330 are changed in that the solder bumps 240 in FIG. 2 have melted to solder 345 which connects connective elements 350 to substrate 310.

Figure 4:
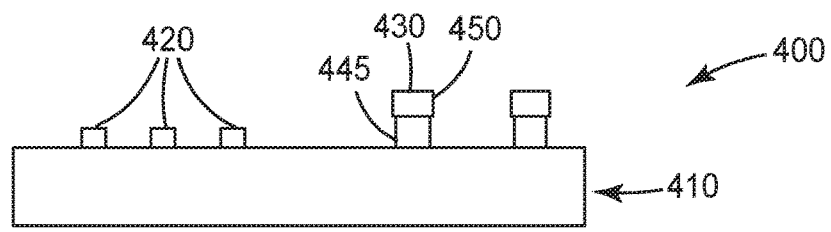
FIG. 4 is a cross sectional view of an embodiment of an article prepared according to the methods of the present disclosure In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

FIG. 4 shows a cross sectional view of article 400 which is article 300 from FIG. 3 from which masking layer 360 has been removed. In article 400, substrate 410 has exposed electronic components with wires 420 that are free of residue from the removed masking layer, and processed electrical components 430 which includes connective elements 450 attached by solder 445 to substrate 410.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted. The following abbreviations are used: mm=millimeters; RPM=revolutions per minute. The terms "weight %", "% by weight", and "wt %" are used interchangeably.

TABLE OF ABBREVIATIONS

| Abbreviation or Trade Designation | Description |
|---|---|
| Block Copolymer-1 | Styrene containing block copolymer commercially available from Kraton Corporation as "KRATON D1161" |
| Block Copolymer-2 | Styrene containing block copolymer commercially available from Kraton Corporation as "KRATON G1726" |
| Block Copolymer-3 | Styrene containing block copolymer commercially available from Kraton Corporation as "KRATON G1730" |
| Tackifier-1 | Tackifying resin commercially available from Cray Valley under the trade name "WINGTACK PLUS" |
| Tackifier-2 | Tackifying resin commercially available from Eastman Chemical Company under the trade name "REGALREZ 1094" |
| Tackifier-3 | Tackifying resin commercially available from ExxonMobil Chemical Company under the trade name "ESCOREZ 5300" |
| Polyolefin-1 | Polyolefin polymer commercially available from Dow Chemical as "INFUSE 9500" |
| Polyolefin-2 | Polyolefin polymer commercially available from Dow Chemical as "INFUSE 9007" |
| Polyolefin-3 | Polyolefin polymer commercially available from Dow Chemical as "ENGAGE 8200" |
| Polyolefin-4 | Polypropylene polymer commercially available from Total Petrochemicals as "PP 3866" |
| Plasticizer-1 | Processing oil commercially available from Chevron as "PARALUX OIL 6001" |
| Antioxidant-1 | Solid anti-oxidant commercially available from BASF as "IRGANOX 1010" |

Preparation and Testing Methods
Preparation of Hot Melt Processable Masking Adhesive Liquid masking adhesives used in the Examples were fabricated using a 30 millimeter (mm) Werner & Pfleiderer co-rotating twin screw extruder. Components were pre-mixed, then volumetrically fed into the extruder feed throat and subjected to 300 rotations per minute (rpm) mixing. The extruder, melt transport, and die temperatures were set to between 170-190° C. for all of Comparative Examples C1-C6 and Examples 1-5. After compounding, the material was collected between two polyester release liners as sheets with a thickness of 0.5 mm.

Thermal Stability Solder Reflow Testing

The sample sheets prepared above were re-melted using a hot melt glue gun and dispensed to provide a masking layer on a printed circuit board with electronic elements and wires. The assembled parts went through a standard solder reflow oven at 260° C. The resulting printed circuit board was then subjected to removal of the masking adhesive layer and evaluated on the cleanliness/residual and flow pattern was compared to the original masking layer shape to assess the degree of excess flow, if any.

Comparative Examples C1-C6

Comparative Example C1

A hot melt processable composition was prepared and tested as described above. The composition components and Thermal Testing results are:

Composition: Polyolefin-1 70 wt %; Tackifier-1 30 wt %.
Thermal Testing Result: Excessive Adhesive Residual after 260° C. Solder Reflow This example demonstrates that the combination of a polyolefin and tackifier does not provide the desired combination of properties.

Comparative Example C2

A hot melt processable composition was prepared and tested as described above. The composition components and Thermal Testing results are:

Composition: Block Copolymer-1 20 wt %; Polyolefin-2 30 wt %; Tackifier-1 50 wt %.

Thermal Testing Result: Substantial Adhesive Residual after 260° C. Solder Reflow This example demonstrates that this combination of materials does not provide the desired combination of properties.

Comparative Example C3

A hot melt processable composition was prepared and tested as described above. The composition components and Thermal Testing results are:

Composition: Block Copolymer-1 10 wt %; Polyolefin-1 40 wt %; Polyolefin-3 40 wt %; Tackifier-1 10 wt %.

Thermal Testing Result: Excessive Adhesive Residual after 260° C. Solder Reflow

This example demonstrates that this combination of materials, using two different polyolefins, does not provide the desired combination of properties.

Comparative Example C4

A hot melt processable composition was prepared and tested as described above. The composition components and Thermal Testing results are:

Composition: Block Copolymer-1 69 wt %; Polyolefin-4 5 wt %; Tackifier-2 20 wt %; Plasticizer-1 5 wt %; Antioxidant-1 1 wt %.

Thermal Testing Result: Adhesive Residual after 260° C. Solder Reflow

This example demonstrates that this combination of materials does not provide the desired combination of properties.

Comparative Example C5

A hot melt processable composition was prepared and tested as described above. The composition components and Thermal Testing results are:

Composition: Block Copolymer-1 24 wt %; Block Copolymer-2 35 wt %; Polyolefin-4 5 wt %; Tackifier-2 30 wt %; Plasticizer-1 5 wt %; Antioxidant-1 1 wt %.

Thermal Testing Result: Adhesive Residual after 260° C. Solder Reflow

This example demonstrates that this combination of materials does not provide the desired combination of properties.

Comparative Example C6

A hot melt processable composition was prepared and tested as described above. The composition components and Thermal Testing results are:

Composition: Block Copolymer-3 24 wt %; Polyolefin-4 5 wt %; Tackifier-3 30 wt %; Plasticizer-1 40 wt %; Antioxidant-1 1 wt %.

Thermal Testing Result: Adhesive Residual after 260° C. Solder Reflow

This example demonstrates that this combination of materials does not provide the desired combination of properties.

Examples 1-5

Example 1

A hot melt processable composition was prepared and tested as described above. The composition components and Thermal Testing results are:

Composition: Block Copolymer-3 39 wt %; Polyolefin-4 5 wt %; Tackifier-3 30 wt %; Plasticizer-1 25 wt %; Antioxidant-1 1 wt %.

Thermal Testing Result: Adhesive was stable in shape, optically transparent, with no excess flow, and was able to be cleanly removed after 260° C. Solder Reflow without leaving residue.

Example 2

A hot melt processable composition was prepared and tested as described above. The composition components and Thermal Testing results are:

Composition: Block Copolymer-3 54 wt %; Polyolefin-4 5 wt %; Tackifier-3 30 wt %; Plasticizer-1 10 wt %; Antioxidant-1 1 wt %.

Thermal Testing Result: Adhesive was stable in shape, optically transparent, with no excess flow, and was able to be cleanly removed after 260° C. Solder Reflow without leaving residue.

Example 3

A hot melt processable composition was prepared and tested as described above. The composition components and Thermal Testing results are:

Composition: Block Copolymer-3 29 wt %; Polyolefin-4 10 wt %; Tackifier-3 30 wt %; Plasticizer-1 30 wt %; Antioxidant-1 1 wt %.

Thermal Testing Result: Adhesive was stable in shape, optically transparent, with no excess flow, and was able to be cleanly removed after 260° C. Solder Reflow without leaving residue.

Example 4

A hot melt processable composition was prepared and tested as described above. The composition components and Thermal Testing results are:

Composition: Block Copolymer-3 24 wt %; Polyolefin-4 15 wt %; Tackifier-3 30 wt %; Plasticizer-1 30 wt %; Antioxidant-1 1 wt %.

Thermal Testing Result: Adhesive was stable in shape, optically transparent, with no excess flow, and was able to be cleanly removed after 260° C. Solder Reflow without leaving residue.

Example 5

A hot melt processable composition was prepared and tested as described above. The composition components and Thermal Testing results are:

Composition: Block Copolymer-3 29 wt %; Polyolefin-4 5 wt %; Tackifier-3 30 wt %; Plasticizer-1 35 wt %; Antioxidant-1 1 wt %.

Thermal Testing Result: Adhesive was stable in shape, optically transparent, with no excess flow, and was able to be cleanly removed after 260° C. Solder Reflow without leaving residue.

What is claimed is:

1. A hot melt processable adhesive composition comprising:
   at least one block copolymer;
   at least one tackifying resin;
   at least one semi-crystalline polyolefin polymer;
   at least one plasticizer; and
   at least one anti-oxidant, wherein the adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

2. The hot melt processable adhesive composition of claim 1, wherein the adhesive composition comprises:
   20-60 weight % of at least one block copolymer;
   20-40 weight % of at least one tackifying resin;
   3-20 weight % of at least one semi-crystalline polyolefin polymer;
   5-40 weight % of at least one plasticizer; and
   0.01-4 weight % of at least one anti-oxidant, where weight % is determined by the total weight of the adhesive composition.

3. The hot melt processable adhesive composition of claim 1, wherein the at least one block copolymer comprises at least one block selected from styrene, ethylene, propylene, isoprene, butylene, butadiene, butene, butadiene, octene, pentene, or any combination thereof.

4. The hot melt processable adhesive composition of claim 1, wherein the at least one block copolymer comprises an optically transparent di-block, tri-block, multi-block, radial-block, or star-block polystyrene-polyolefin block copolymer or a combination thereof.

5. The hot melt processable adhesive composition of claim 1, wherein the at least one block copolymer comprises an optically transparent di-block copolymer of styrene and ethylene/propylene or an optically transparent tri-block copolymer of styrene and ethylene and butylene.

6. The hot melt processable adhesive composition of claim 1, wherein the at least one tackifying resin is selected from a C4 hydrocarbon tackifier, a C9 hydrocarbon tackifier, a rosin ester tackifier, a terpene tackifier, and a terpene phenol tackifier, or any combination thereof.

7. The hot melt processable adhesive composition of claim 6, wherein the at least one tackifying resin has a softening point of from 80° C. to 180° C.

8. The hot melt processable adhesive composition of claim 1, wherein the at least one semi-crystalline olefin polymer comprises blocks or segments of ethylene, propylene, butene, hexene, octene, or any combination thereof.

9. The hot melt processable adhesive composition of claim 1, wherein the at least one semi-crystalline olefin polymer comprises a polyethylene, polypropylene, LLDPE (linear low density polyethylene), LDPE (low density polyethylene), HDPE (high density polyethylene), or block or random copolymers thereof.

10. The hot melt processable adhesive composition of claim 1, wherein the at least one semi-crystalline olefin polymer has a crystalline melt enthalpy as measured by DSC in the range of 1-80 Joules/gram.

11. The hot melt processable adhesive composition of claim 1, wherein the at least one plasticizer comprises a processing oil.

12. The hot melt processable adhesive composition of claim 11, wherein the at least one processing oil comprises a non-aromatic paraffinic oil, an aromatic oil, a naphthenic oil, or a combination thereof.

13. The hot melt processable adhesive composition of claim 1, wherein the at least one anti-oxidant comprises benzenepropanoic acid, hydroxy methyl ester, pentaerythritol tetrakis hydroxyphenyl propionate, bis(dodecylthiomethyl) methylphenol, octadecyl hydroxyphenyl propionate, butylphenyl phosphite, or mixtures thereof.

14. An article comprising:
   an electronic device comprising:
      a substrate with a first major surface and a second major surface, with a variety of electronic components disposed on the first major surface of the substrate;
      a masking adhesive layer disposed on at least a portion of the first major surface of the substrate and/or at least one electronic component disposed on the first major surface of the substrate, wherein the masking adhesive comprises:
         a hot melt processable adhesive composition comprising:
            at least one block copolymer;
            at least one tackifying resin;
            at least one semi-crystalline polyolefin polymer;
            at least one plasticizer; and
            at least one anti-oxidant, wherein the adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable.

15. The article of claim 14, wherein the masking adhesive layer has been applied by 3D (3 dimensional) printing.

16. The article of claim 14, wherein the masking adhesive layer has been applied by hot melt jetting at a temperature of 100-200° C.

17. The article of claim 14, wherein the masking adhesive layer is optically transparent.

18. The article of claim 14, wherein the masking adhesive layer has a thickness of from 10 micrometers to 10 millimeters.

19. The article of claim 14, wherein the masking adhesive layer is a colored layer and wherein the colored masking adhesive layer substantially matches the component on which it is disposed.

20. A method of preparing a device comprising:
   providing an electronic device comprising:
      a substrate with a first major surface and a second major surface, with a variety of electronic components disposed on the first major surface of the substrate;
   providing a hot melt processable masking adhesive wherein the masking adhesive comprises:
      a hot melt processable adhesive composition comprising:
         at least one block copolymer;
         at least one tackifying resin;
         at least one semi-crystalline polyolefin polymer;
         at least one plasticizer; and
         at least one anti-oxidant, wherein the adhesive composition is a hot melt processable pressure sensitive adhesive composition that is thermally stable, such that the composition when disposed on a surface withstands heating to 260° C. without degradation or flowing, remains optically transparent, and after heating to 260° C. remains cleanly removable;

melting the adhesive composition in a receptacle;

hot melt dispensing the molten hot melt processable adhesive composition on at least a portion of the first major surface of the substrate, on at least one electronic component disposed on the first major surface of the substrate, or a combination of the first major surface and at least one electronic component to form a masking adhesive layer;

processing the electronic device such that processing involves at least subjecting at least a portion of the electronic device to a temperature of 260° C.; and removing the masking adhesive layer after processing.

21. The method of claim 20, wherein processing the electronic device comprises a solder reflow process.

22. The method of claim 20, wherein hot melt dispensing of the hot melt processable adhesive composition comprises 3D (3 dimensional) printing.

\* \* \* \* \*